(12) United States Patent
Ikeda

(10) Patent No.: US 8,714,997 B2
(45) Date of Patent: May 6, 2014

(54) TERMINAL AND TERMINAL CONNECTING CONSTRUCTION

(75) Inventor: Takayuki Ikeda, Makinohara (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 13/359,550

(22) Filed: Jan. 27, 2012

(65) Prior Publication Data

US 2012/0196457 A1 Aug. 2, 2012

(30) Foreign Application Priority Data

Jan. 28, 2011 (JP) ................................. 2011-015993

(51) Int. Cl.
*H01R 13/00* (2006.01)

(52) U.S. Cl.
USPC ........................................ 439/487; 439/76.2

(58) Field of Classification Search
USPC ................. 439/76.1, 76.2, 78, 487, 701, 949; 361/704
See application file for complete search history.

(56) References Cited

U.S. PATENT DOCUMENTS

| | | | | |
|---|---|---|---|---|
| 3,805,117 | A | * | 4/1974 | Hausman ....................... 361/743 |
| 4,494,814 | A | * | 1/1985 | Oyama .......................... 439/485 |
| 5,170,067 | A | * | 12/1992 | Baum et al. .................... 307/10.1 |
| 5,281,154 | A | * | 1/1994 | Comerci et al. ............... 439/107 |
| 5,398,166 | A | * | 3/1995 | Yonezawa et al. ............. 361/784 |
| 6,266,244 | B1 | | 7/2001 | Guthrie |
| 6,337,796 | B2 | | 1/2002 | Yamada et al. |
| 6,781,840 | B2 | | 8/2004 | Ikushima et al. |
| 8,038,465 | B2 | * | 10/2011 | Pavlovic ........................ 439/485 |
| 8,215,981 | B2 | * | 7/2012 | Liu et al. ........................ 439/487 |
| 2012/0155030 | A1 | | 6/2012 | Breitenbach et al. |

FOREIGN PATENT DOCUMENTS

| | | |
|---|---|---|
| DE | 92 13 671.0 U1 | 2/1993 |
| EP | 1 601 014 A1 | 11/2005 |
| JP | 2-7374 A | 1/1990 |
| JP | 2-119073 A | 5/1990 |
| JP | 2007-35788 A | 2/2007 |
| WO | 87/05183 A1 | 8/1987 |
| WO | 2010/142490 A1 | 12/2010 |

OTHER PUBLICATIONS

Office Action dated Feb. 19, 2014, issued by the German Patent and Trademark Office in counterpart German Application No. 10 2012 100 511.7.

Office Action dated Dec. 20, 2013, issued by the State Intellectual Property Office of the P.R.C. in corresponding Chinese Application No. 201210021572.9.

* cited by examiner

*Primary Examiner* — Thanh Tam Le

(74) *Attorney, Agent, or Firm* — Sughrue Mion, PLLC

(57) ABSTRACT

A terminal connecting construction includes a substrate and a terminal. A heat-generating element is mounted on the substrate. A contact portion is provided in the terminal, and is contacted with the heat-generating element.

9 Claims, 6 Drawing Sheets

TERMINAL AND TERMINAL CONNECTING CONSTRUCTION

BACKGROUND

The present invention is related to a terminal which is connected to a pattern on a substrate on which a heat-generating element is mounted.

As Patent Documents 1 and 2 disclose, patterns on a substrate are connected to exterior components via terminals. In terminals disclosed in Patent Documents 1 and 2, a substrate is held in a thickness direction by a pair of holding pieces provided at one end thereof, and the terminal is connected to a pattern on the substrate by one of the pair of holding pieces. In the terminals of this type, the other end is connected through press fitting or connected via a connector to a wiring.

Heat-generating elements such as LEDs and power transistors are mounted on a substrate from time to time. In such a substrate, in order to dissipate heat generated by the heat-generating elements, as Patent Document 3 below discloses, a heat sink needs to be mounted on the substrate. Because of this, there have been cases where heat that has once been dissipated to the substrate from the heat-generating element has to be dissipated to the outside of the substrate via the heat sink.

[Patent Document 1] JP-A-2-119073
[Patent Document 2] JP-A-2-7374
[Patent Document 3] JP-A-2007-35788

SUMMARY

It is therefore one advantageous aspect of the present invention to provide a terminal which can dissipate heat generated by a heat-generating element such as an LED or a power transistor mounted on a substrate.

According to one advantage of the invention, there is provided a terminal configured to be connected to a pattern on a substrate on which a heat-generating element is mounted, comprising:

a contact portion configured to be connected to the heat-generating element.

According to another advantage of the invention, there is provided a terminal connecting construction, comprising:

a substrate on which a heat-generating element is mounted;
a terminal; and
a contact portion provided in the terminal, and contacted with the heat-generating element.

The substrate may be provided in a housing, a locking portion may be provided in the housing, and the terminal may include a locked portion locked in the locking portion.

The terminal may include a pair of holding pieces which holds the substrate, and the contact portion may be extended from one of the holding pieces.

The heat-generating element may be a power transistor.

BRIEF DESCRIPTION OF DRAWINGS

FIGS. 4A and 4B show drawings depicting a terminal, of which FIG. 4A is a perspective view of the terminal as viewed from therabove, and FIG. 4B is a perspective view of the terminal as viewed from therebelow.

DETAILED DESCRIPTION OF EXEMPLIFIED EMBODIMENTS

Figure 1:
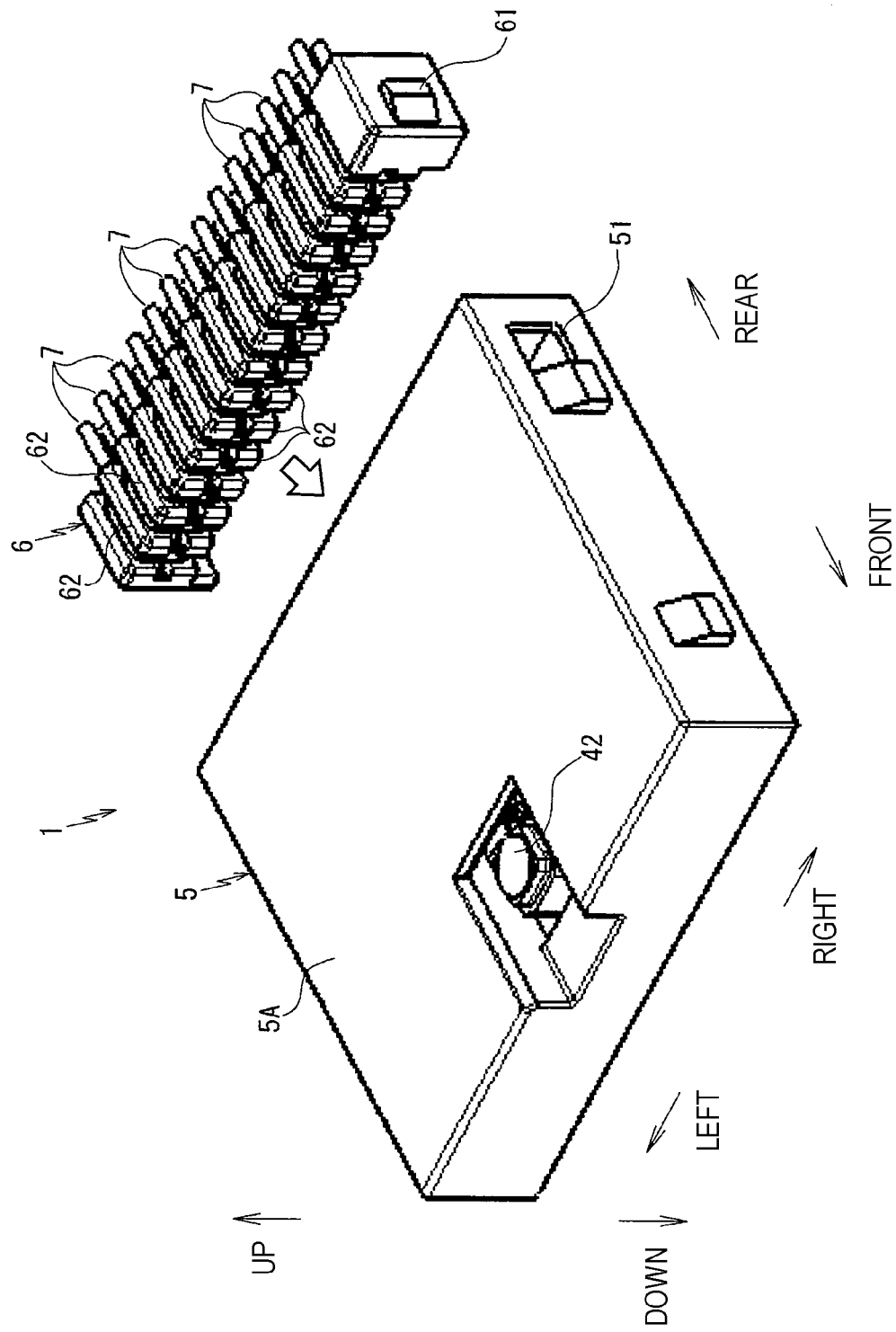
FIG. 1 is a perspective view of an electronic device according to one embodiment of the invention.

Hereinafter, referring to the drawings, an embodiment of the invention will be described.

Upward and downward directions, forward and rearward directions and leftward and rightward directions which are used to describe the embodiment are shown in the individual drawings. These directions are shown for the purpose of describing the embodiment, and hence, they may, of course, be different from actual arrangements.

Figure 2:
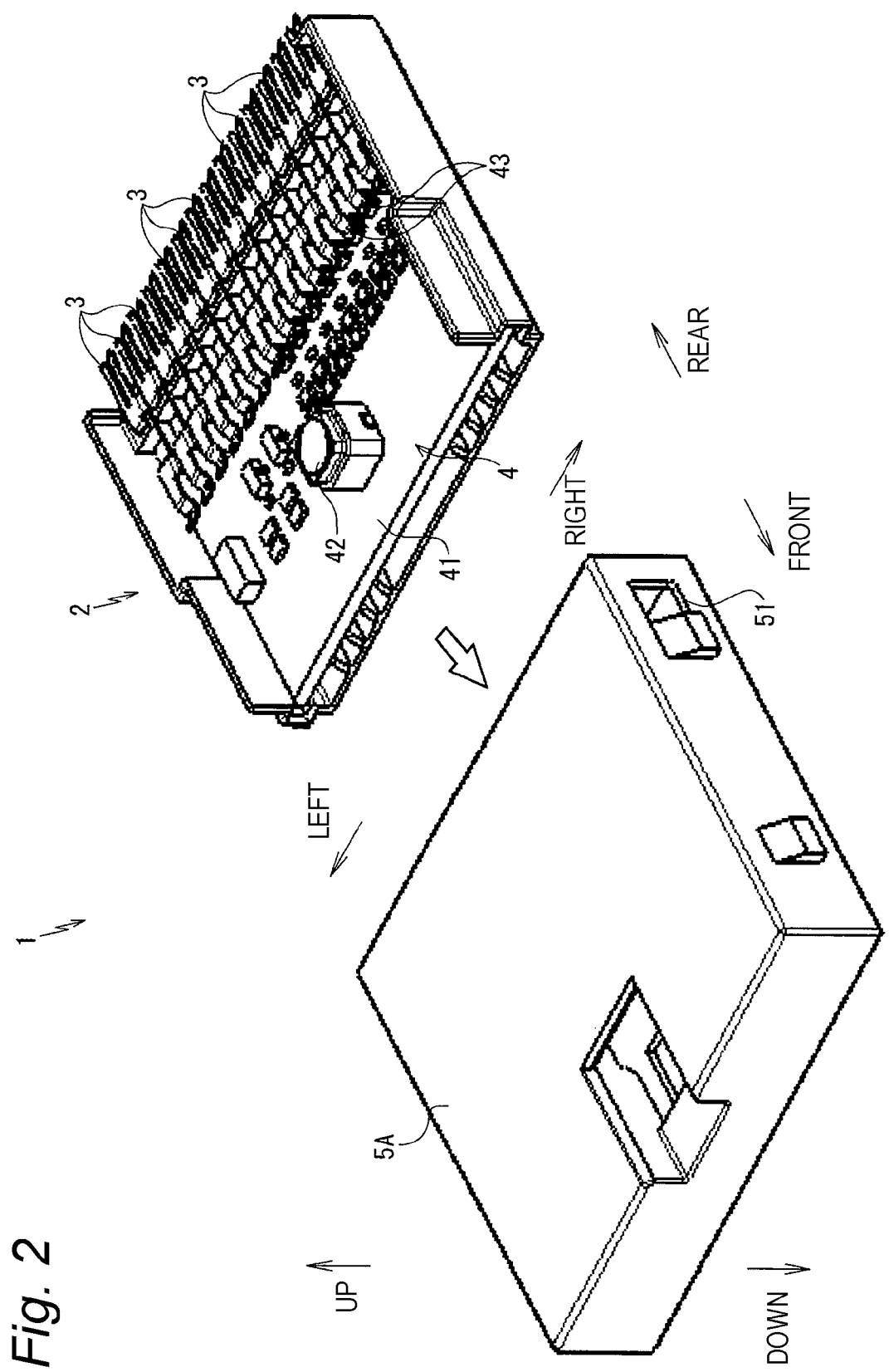
FIG. 2 is an exploded perspective view of a device main body included in the electronic device shown in FIG. 1.

An electronic device 1 shown in FIG. 1 includes a device main body 5 which incorporates electronic components and a holder 6 which holds electric wires 7 which are connected to the device main body 5. As FIG. 2 shows, in the device main body 5, a substrate 4 and terminals 3 which are connected to patterns on the substrate 4 are mounted in a housing 2, and the housing 2 is inserted into a cover 5A as indicated by a thick arrow in FIG. 2 for accommodation in the cover 5A. The cover 5A has a quadrangular parallelepiped box shape which is opened in a rear side, and an engagement hole 51 is formed in each of left and right lateral sides thereof.

As FIG. 1 shows, in the holder 6, electric wires 7 are accommodated between a plurality of holding portions 62 which are aligned in a transverse direction, and an engagement projecting portion 61 is provided on each of left and right lateral sides of the holder 6 for engagement with the corresponding engagement hole 51 in the cover 5A. As indicated by a thick arrow shown in FIG. 1, when the holder 6 is mounted in an opening portion at a rear end of the cover 5A, the engagement projections 61 are brought into engagement with the corresponding engagement holes 51, whereby the holder 6 is locked in the device main body 5.

Figure 3A:
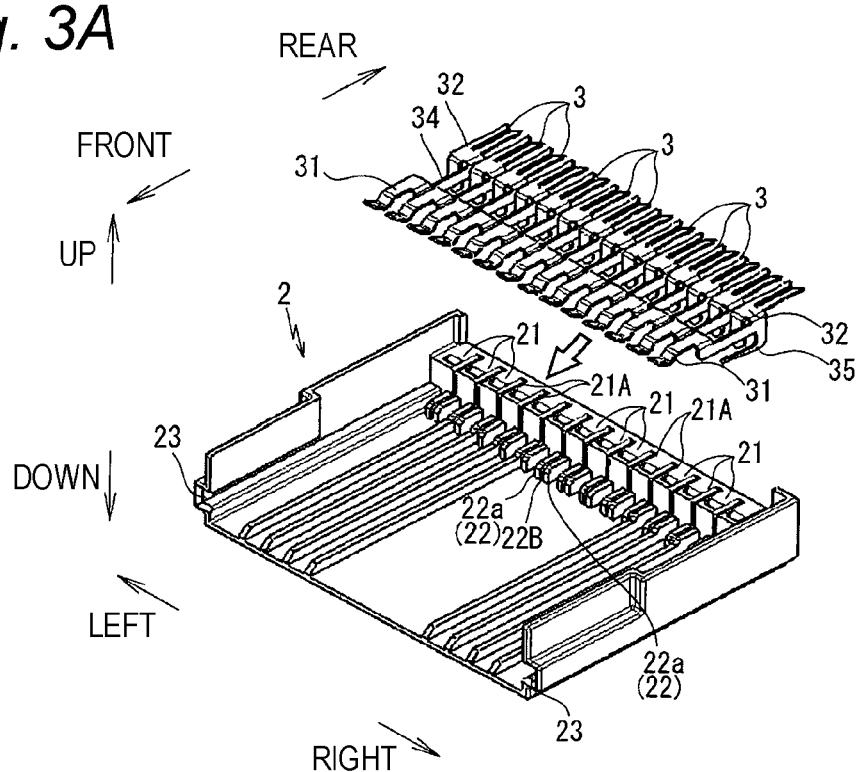
FIGS. 3A and 3B show drawings depicting assembling methods of assembling terminals and a substrate to a housing included in the device main body.

As FIG. 3A shows, the housing 2 includes terminal mounting portions 21 in which the terminals 3 are mounted, accommodation members 22 which accommodate substrate connecting terminal portions 34 of the terminals 3 and guide recess portions 23 which guide the substrate 4. The terminal mounting portions 21 are arranged in the transverse direction with accommodation grooves 21A provided between the adjacent terminal mounting portions 21. Then, the terminals 3 are mounted individually in the terminal mounting portions 21 from thereabove as indicated by a thick arrow shown in FIG. 3A. Each accommodation member 22 includes a pair of accommodation tongue pieces 22a which is disposed so as to define accommodation grooves 21A between adjacent accommodation tongue pieces 22a or an accommodation tongue piece 22a and a right lateral side plate of the housing 2. The guide recess portions 23 guide both sides of the substrate 4 to the substrate connecting terminal portions 34.

Figure 3B:
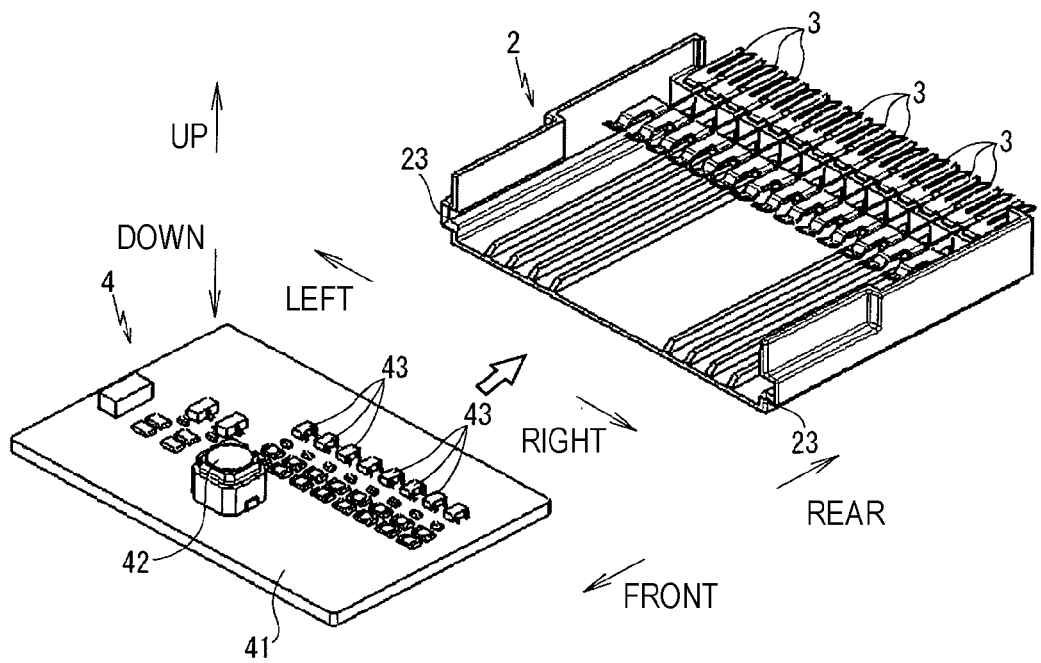

As FIG. 3B shows, the substrate 4 includes electronic components such as switches 42 and power transistors 43 which are provided on an upper side of a substrate main body 41 on which patterns are formed. The power transistors 43 are aligned in the transverse direction at equal intervals on the upper side of the substrate main body 41. The substrate 4 is inserted into an opening portion at a front end of the housing 2 as indicated by a thick arrow shown in FIG. 3B for connection with the substrate connecting terminal portions 34 of the terminals 3 mounted in the terminal mounting portions 21.

Figure 4A:
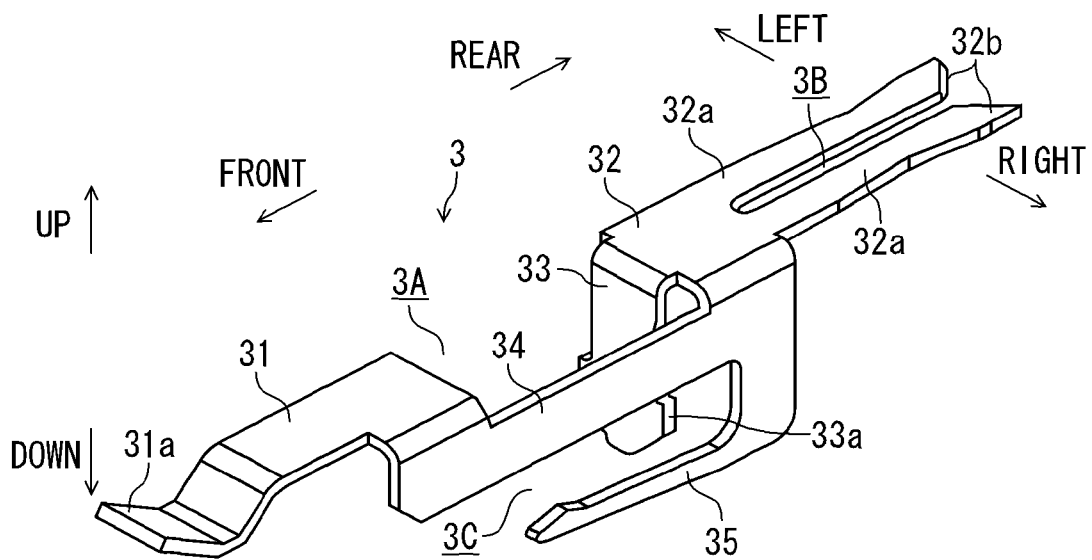
Figure 4B:
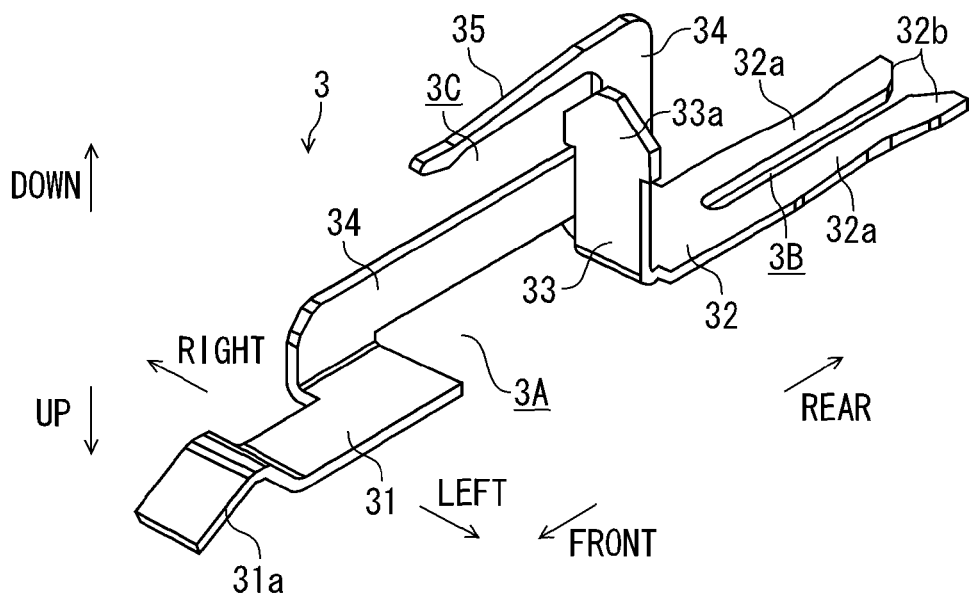

FIG. 4A is a perspective view of the terminal 3 as viewed from thereabove, and FIG. 4B is a perspective view of the terminal as viewed from therebelow. As FIGS. 4A and 4B show, the terminal 3 includes a heat-generating element contact portion 31 which has a flat plate-like shape and which extends in a longitudinal direction, a wire connecting portion 32 which extends in the longitudinal direction with a space 3A defined between the heat-generating element contact portion 31 and itself, a locked portion 33 which has a flat plate-like shape and which extends downwards from a front edge of the wire connecting portion 32, and the substrate connecting terminal portion 34 which extends downwards from a right edge of a rear end portion of the heat-generating element contact portion 31 and a right edge of a front end portion of the wire connecting portion 32 so as to connect the heat-generating element contact portion 31 with the wire connecting portion 32.

A contact portion 31a is provided at a front end portion of the heat-generating element contact portion 31. This contact portion 31a is formed by bended part of the heat-generating element contact portion 31 downwards into a V-like shape. Connecting portions 32a are provided at a rear end portion of the wire connecting portion 32. These connecting portions 32a are disposed side by side with a space 3B defined therebetween and extend rearwards in a flat plate-like fashion. Guide portions 32b are provided at respective rear end portions of both the connecting portions 32a by expanding the space 3B in the transverse direction. A wider portion 33a is provided at a lower end portion of the locked portion 33 by widening the width of the lower end portion of the locked portion 33. A lower end portion of the wider portion 33a is tapered gradually towards a lower end thereof.

An electrically communicating portion 35 extends from a lower edge of a rear end portion of the substrate connecting terminal portion 34 into an L-like shape with a space 3C defined with the substrate connecting terminal portion 34. The electrically communicating portion 35 extends downwards from the lower edge of the substrate connecting terminal portion 34 while being formed into a rectangular flat plate-like shape and thereafter extends forwards while gradually reducing a vertical width. An engagement portion which swells upwards is provided at a front end portion of the electrically communicating portion 35.

Figure 5:
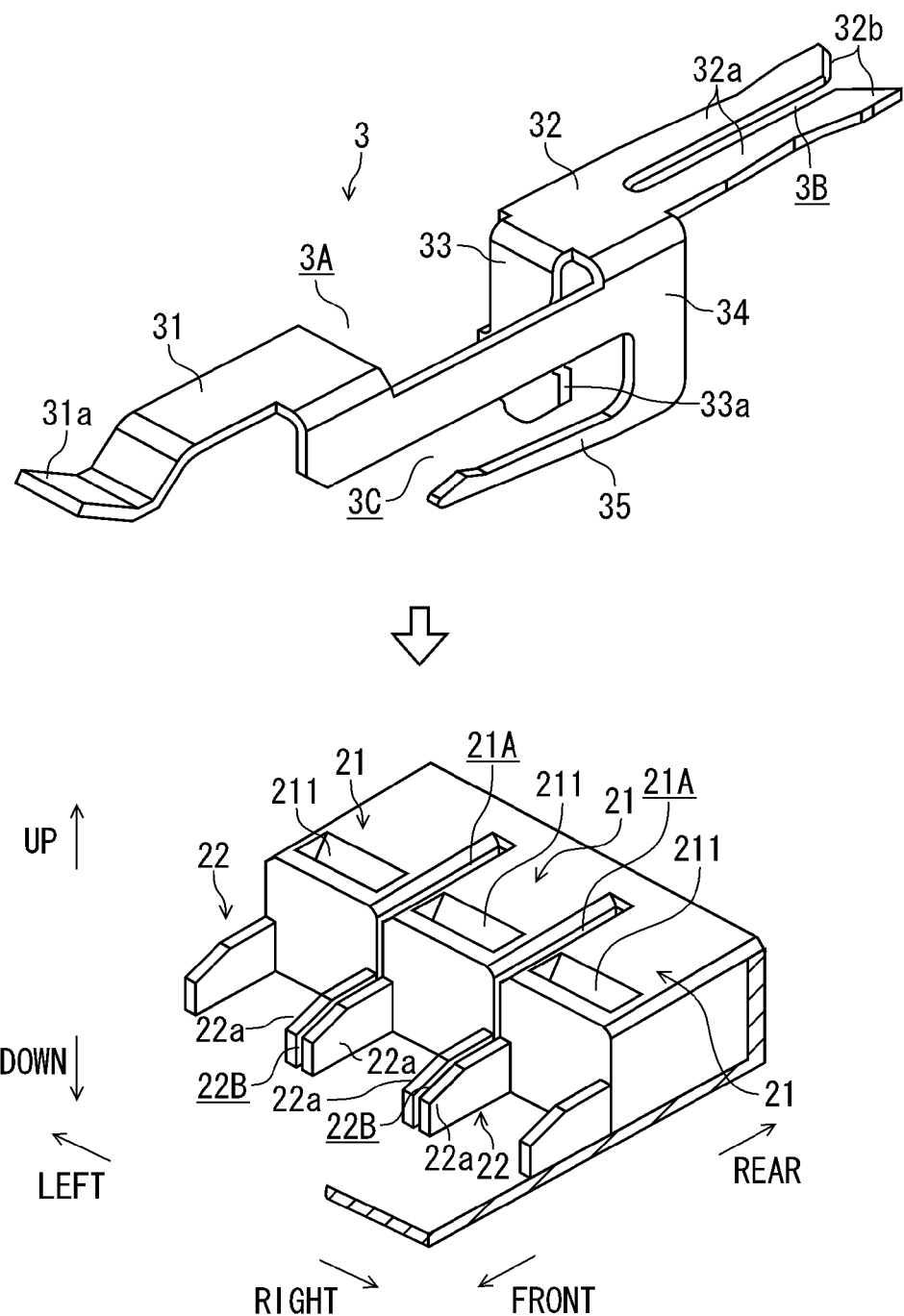
FIG. 5 is a drawing depicting the configuration of a terminal mounting portion included in the housing and an assembling method of a terminal into the terminal mounting portion.

The terminal 3 is mounted in the terminal mounting portion 21 from thereabove as indicated by a thick arrow in a posture shown in FIG. 5. As FIG. 5 shows, the terminal mounting portion 21 extends forwards from a rear side plate of the housing 2 while being formed into the shape of a quadrangular parallelepiped block. A locking hole 211 is opened in an upper side of a front end portion of the terminal mounting portion 21. An opening portion at an upper end of the locking hole 211 is formed so that a longitudinal width is gradually increased towards the upper end of the hole.

The accommodation tongue pieces 22a which make up the accommodation member 22 extend forwards from left and right edge portions of a front end face of the terminal mounting portion 21. Each accommodation tongue piece 22a extends forwards with a left or right lateral side oriented towards the accommodation groove 21A made flush with a left or right lateral side of the terminal mounting portion 21 which is oriented in the same direction. An upper side of a front end portion of the accommodation tongue piece 22a is inclined downwards gradually from a rear end towards a front end. The adjacent accommodation members 22 define accommodation grooves 22B which communicate with the accommodation grooves 21A and which extend in the longitudinal direction.

Figure 6:
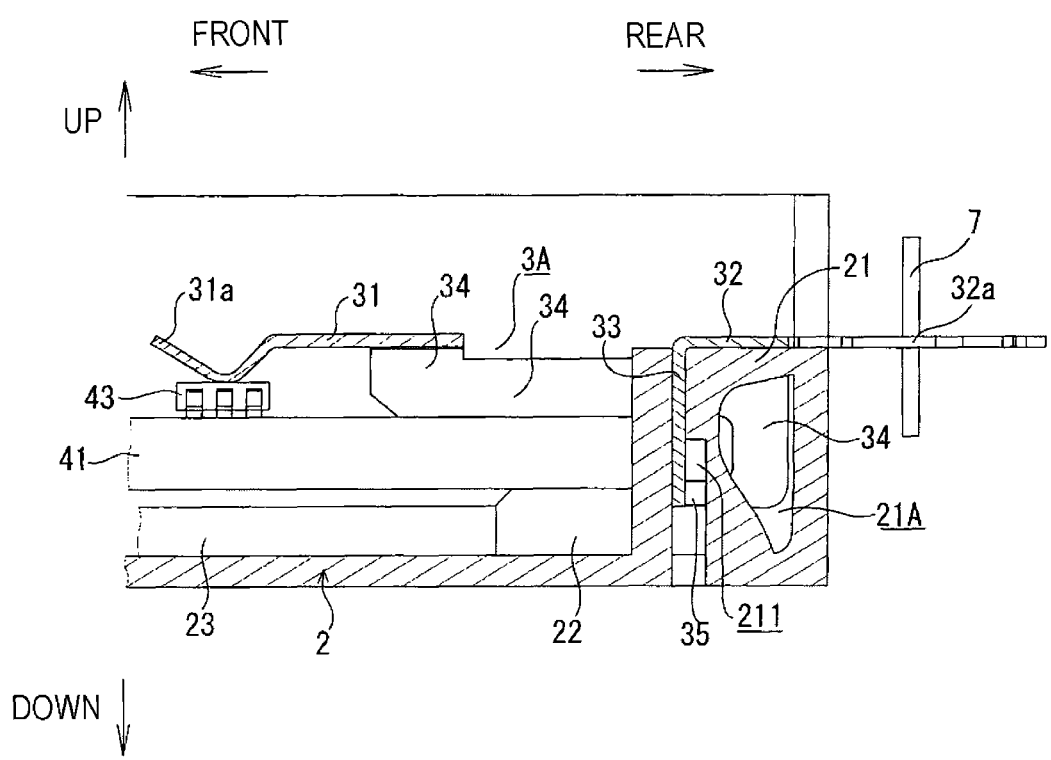
FIG. 6 is a drawing depicting a connecting method of connecting the substrate and an electric wire with the terminal.

In the terminal 3 mounted in the terminal mounting portion 21, as FIG. 6 shows, the wire connecting portion 32 is placed on an upper side of the terminal mounting portion 21, and the heat-generating element connecting portion 31 extends forwards, while the connecting portions 32a extend rearwards. The looked portion 33 is inserted into an interior of the locking hole 211, and the wider portion 33a is locked on left and right lateral walls of the locking hole 211. The rear end portion of the substrate connecting terminal portion 34 is accommodated in the accommodation groove 21A. The electrically communicating portion 35 is accommodated in the accommodation groove 21A and the accommodation groove 22B with the engagement portion thereof positioned above the accommodation member 22.

As FIG. 6 shows, when the substrate 4 is inserted between the substrate connecting terminal portion 34 and the electrically communicating portion 35, the engagement portion of the electrically communicating portion 35 which is positioned above the accommodation member 22 is brought into abutment with the substrate 4 to thereby deflect the electrically communicating portion 35 downwards, whereby the substrate 4 is held by the substrate connecting terminal portion 34 and the electrically communicating portion 35. Additionally, the power transistor 43 on the substrate 4 is brought into abutment with the contact portion 31a which is positioned forwards of the substrate connecting terminal portion 34 to thereby deflect the heat-generating element contact portion 31 upwards, whereby the power transistor 43 is held between the substrate main body 41 and the heat-generating element contact portion 31. In addition, when the electric wire 7 is inserted into the space 3B defined between the connecting portions 32a as the holder 6 is mounted in the cover 5A, a covering of the electric wire 7 is cut off by both the connecting portions 32a. Then, a conductor placed in the center of the electric wire 7 is held between the connecting portions 32a, whereby an electrical communication is established between the terminal 3 and the electric wire 7.

When the substrate 4 is inserted into and removed from between the substrate connecting terminal portion 34 and the electrically communicating portion 35 and the electric wire 7 is inserted into and removed from between the connecting portions 32a, the terminal 3 is pushed rearwards or forwards by the substrate 4 or the electric wire 7. However, the locked portion 33 is locked in the locking hole 211, and therefore, the terminal 3 is restricted from moving forwards and rearwards. Additionally, front and rear sides of the locked portion 33 are brought into abutment with front and rear inner sides of the locking hole 211, and therefore, the terminal 3 is restricted from moving forwards and rearwards. A rear edge portion of the substrate connecting terminal portion 34 is brought into abutment with a rear inner side of the accommodation groove 21A, and therefore, the terminal 3 is restricted from moving rearwards. Thus, the forward and rearward movements of the terminal 3 that result when the terminal 3 is pressed by the substrate 4 or the electric wire 7 are restricted in a more ensured fashion.

According to the embodiment of the invention, by bringing the heat-generating element contact portion 31 into contact with the power transistor 43 mounted on the substrate 4, heat generated by the power transistor 43 can be dissipated by way of the terminal 3 and the electric wire 7. This can promote the dissipation of heat generated in the heating portion with providing no heat sink.

According to the embodiment, by locking the wider portion 33a of the looked portion 33 in the locking hole 211 in the housing 2, the terminal 3 is restricted from moving when the substrate 4 and the electric wire 7 are attached to and detached from the terminal 3, thereby making it possible to reduce the load applied to the connecting portions between the substrate 4 and the electric wire 7 with the terminal 3.

According to the embodiment, the forward and rearward movements of the locked portion 33 are restricted by the locking hole 211, and the rearward movement of the substrate connecting terminal portion 34 is restricted by the accommodation groove 21A. Therefore, it is possible to reduce the load applied to the connecting portions between the substrate 4 and the electric wire 7 with the terminal 3 when the substrate 4 and the electric terminal 7 are press fitted in the terminal 3. Moreover, the electric wire 7 is held between the pair of connecting portions 32a which extend rearwards so as to be connected to the terminal 3 from the opposite direction to the direction in which the substrate 4 is connected to the terminal 3. Therefore, it is possible to reduce the accommodation space for the substrate 4 and the electric wire 7 which are connected to the terminal 3. As a result, the electronic device 1 can be made compact in size.

According to the embodiment, the substrate 4 is guided by the guide recess portions 23 so as to be inserted into the housing 2 and is then connected to the plurality of terminals 3 at one time. Therefore, the attachment and detachment of the substrate 4 to and from the terminals 3 can be facilitated.

According to the embodiment, the heat-generating element contact portion 31 extends from the substrate connecting terminal portion 34 which holds the substrate 4 together with the electrically communicating portion 35. Therefore, the contact portion 31a of the heat-generating element contact portion 31 can be pressed strongly against the power transistor 43, thereby making it possible to dissipate heat from the power transistor 43 to the terminal 3 and the electric wire 7.

In the embodiment, while the terminal 3 is described as being mounted in the housing 2 by locking the locked portion 33 of the terminal 3 in the locking hole 211 in the housing 2, a configuration may be adopted in which the locked portion of the terminal 3 is locked in a locking portion provided in the cover 5A so that the terminal 3 is mounted in the cover 5A. According to this configuration, too, the forward and rearward movements of the terminal 3 are restricted by the locking portion, and the rearward movement of the electrically communicating portion 35 is restricted by the accommodation groove 21A. Therefore, it is possible to reduce the load applied to the connecting portions of the substrate 4 and the electric wire 7 with the terminal 3 when the substrate 4 and the electric wire 7 are connected to the terminal 3. In addition, it is possible to reduce the height of the accommodation space for the substrate 4 and the electric wire 7 which are connected to the terminal 3, thereby making it possible to make the electronic device 1 compact in size. Moreover, since no locking portion has to be provided in the housing 2, the configuration of the housing 2 is simplified, thereby making it possible to facilitate the fabrication of the housing 2.

In addition, in the embodiment, while the heat-generating element contact portion 31 is described as including the contact portion 31a, the configuration of the heat-generating element contact portion 31 is arbitrary. In addition, the substrate connecting portion 34 may extend in the horizontal direction continuously with the heat-generating element contact portion 31 and the wire connecting portion 32 with no space 3A provided between the heat-generating element contact portion 31 and the wire connecting portion 32. Additionally, no guide portion 32b may be provided on the wire connecting portion 32.

While the guide recess portions 23 are formed into the U-like shape, guide portions 23 may be formed by ribs. Additionally, either of the substrate 4 and the electric wire 7 may be connected first to the terminal 3. In addition, in the embodiment, while the locking portion is described as being made up of the locking hole 211 and the locked portion 33 as being made up of the flat plate-like projection, the locking portion may be formed by a groove, and the locked portion 33 by an elongated projection. According to this configuration, too, the movement of the locked portion 33 can be restricted by the locking portion, whereby the same function and advantage as those of the embodiment can be obtained.

In addition, the locking portion may be made up of an elongated projection or a projection, and the locked portion may be made up of a groove or a hole. In the embodiment, while the electric wire 7 is described as being press fitted in the terminal 3, a configuration may be adopted in which the electric wire 7 is connected to the terminal 3 by a connector.

What is claimed is:

1. A terminal configured to be connected to a pattern on a substrate on which a heat-generating element is mounted, comprising:
    a contact portion configured to be connected to the heat-generating element, the contact portion having a plate-like shape extending in a first direction; and
    a locked portion configured to be locked in a housing in which the substrate is provided, the locked portion extending in a second direction perpendicular to the first direction and being separated from the contact portion by an open space,
    wherein the contact portion comprises an end portion which is bent such that the end portion contacts the heat-generating element when the terminal is connected to the pattern on the substrate.

2. The terminal as set forth in claim 1, further comprising:
    a pair of holding pieces configured to hold the substrate,
    wherein the contact portion is extended from one of the holding pieces.

3. The terminal as set forth in claim 1, wherein the heat-generating element is a power transistor.

4. The terminal as set forth in claim 1, wherein the end portion is bent in a V-shape.

5. The terminal as set forth in claim 4, further comprising:
    a pair of connecting portions extending in a third direction opposite to the first direction; and
    a space formed between the guide portions,
    wherein each of the connecting portions comprises a guide portion formed at a respective end thereof, the guide portions comprising angled surfaces configured to guide a wire into the space.

6. A terminal connecting construction, comprising:
    a substrate on which a heat-generating element is mounted; and
    a terminal, comprising:
        a contact portion which contacts the heat-generating element, the contact portion having a plate-like shape which extends in a first direction, and
        a locked portion configured to be locked in a housing in which the substrate is provided, the locked portion extending in a second direction perpendicular to the first direction and being separated from the contact portion by an open space,
        wherein the contact portion comprises an end portion which is bent such that the end portion contacts the heat-generating element when the terminal is connected to a pattern on the substrate.

7. The terminal connecting construction as set forth in claim 6, wherein
   a locking portion is provided in the housing, and
   the locked portion is configured to be locked in the locking portion.

8. The terminal connecting construction as set forth in claim 6, wherein
   the terminal includes a pair of holding pieces which holds the substrate, and
   the contact portion is extended from one of the holding pieces.

9. The terminal connecting construction as set forth in claim 6, wherein
   the heat-generating element is a power transistor.

\* \* \* \* \*